United States Patent [19]

Jacoby

[11] Patent Number: 4,790,374

[45] Date of Patent: Dec. 13, 1988

[54] AIRFLOW DIRECTIONAL VANE FOR A HEATSINK

[75] Inventor: John H. Jacoby, Providence, R.I.

[73] Assignee: PinFin, Inc., Warren, R.I.

[21] Appl. No.: 61,465

[22] Filed: Jun. 15, 1987

[51] Int. Cl.$^4$ .............................. F28F 7/00; H02B 7/34
[52] U.S. Cl. .................................... 165/185; 165/80.3; 174/16.3
[58] Field of Search ............... 165/80.3, 185; 361/383, 361/384; 357/81; 174/16 HS; 123/41.61

[56] References Cited

U.S. PATENT DOCUMENTS

| Re. 20,251 | 1/1937 | Davis | 123/41.61 X |
|---|---|---|---|
| 1,412,634 | 4/1922 | Schrieber | 123/41.61 |
| 1,778,527 | 10/1930 | Hartley | 123/41.61 |
| 2,249,319 | 7/1941 | Lohner | 123/41.61 |
| 2,644,435 | 7/1953 | Hoxie | 123/41.61 X |
| 2,710,601 | 6/1955 | Kloss | 123/41.61 |

FOREIGN PATENT DOCUMENTS

| 2412992 | 10/1975 | Fed. Rep. of Germany | 361/384 |
|---|---|---|---|
| 712991 | 1/1980 | U.S.S.R. | 361/383 |

Primary Examiner—Ira S. Lazarus
Assistant Examiner—Peggy Neils
Attorney, Agent, or Firm—Joseph S. Iandiorio; Douglas E. Denninger

[57] ABSTRACT

An airflow directional vane for a heatsink carrying a plurality of heat-dissipating elements which extend from a base including a vane element which is mounted directly to at least one of the heat-dissipating elements of the heatsink. The vane element extends outwardly from the heatsink to direct airflow across the heatsink through the heat-dissipating elements.

16 Claims, 2 Drawing Sheets

AIRFLOW DIRECTIONAL VANE FOR A HEATSINK

FIELD OF INVENTION

This invention relates to an airflow directional vane for a heatsink and, more particularly, to a device which increases the airflow across the heat-dissipating elements of the heatsink.

BACKGROUND OF INVENTION

Printed circuit boards and other electronic components often require the use of heatsinks to dissipate heat generated by the electronic components. Such heatsinks typically include a thin heat-conducting base which is mounted to the component of interest and a plurality of pins, fins or other metallic heat-dissipating elements which extend from the base.

To enhance heat dissipation by these devices, cooling air may be directed to flow past the heat-dissipating element. To date, however, such techniques have not provided optimal enhancement of heat dissipation. This is because the tightly packed fins or pins of the heatsink tend to block the airflow through those elements. This creates a pressure differential that causes a substantial portion, e.g. 75% to 80%, of the airflow directed at the heatsink to pass around the outside of the heatsink. As a result, much of the cooling air avoids contact with the pin or fin elements of the heatsink and optimal cooling is not achieved.

In an attempt to overcome this problem and increase the airflow through the heat-dissipating elements, certain techniques have altered the size, shape and/or diameter of the pins or other elements. However, such changes often adversely affect heatsink performance. Alternatively, a separate air-conducting manifold has been provided to serve each heatsink in the equipment. However, such an apparatus is expensive and complicated to install and there may not be sufficient space available for accommodating a separate manifold duct for each and every heatsink.

SUMMARY OF INVENTION

It is therefore an object of this invention to provide an airflow directional vane which effectively increases airflow through the heat-dissipating elements of the heatsink.

It is a further object of this invention to provide an airflow directional vane for a heatsink that is simple, quick and inexpensive to manufacture, install and operate.

It is a further object of this invention to provide an airflow directional vane for a heatsink that eliminates the need for complex, bulky and expensive manifolds.

It is a further object of this invention to provide an airflow directional vane which is particularly effective for use with multiple-pin and multiple-fin heatsinks and other heatsinks used in electronics applications.

The invention results from the realization that the cooling airflow which crosses the heat-dissipating elements of a heat sink may be simply, inexpensively, and yet, dramatically increased by employing a directional vane that is mounted directly to the heat-dissipating elements of the heat sink.

This invention features an airflow directional vane for a heatsink having a plurality of heat-dissipating elements which extend from the base including a vane element and means for mounting the vane element to at least one of the heat-dissipating elements of the heatsink. The vane element extends outwardly from the heatsink to direct airflow across the heatsink through the heat-dissipating elements.

In a preferred embodiment, the vane element is at least as tall as the heat-dissipating elements. The means for mounting may include at least one retaining portion having means for receiving a respective heat-dissipating element. At least one such retaining portion may be carried proximate one end of the vane element. The vane element and the means for mounting may be integrally connected and the directional vane may include a heat-dissipating material.

An airflow directional vane apparatus according to this invention may be constructed using a pair of directional vanes constructed as previously described. The directional vanes include respective first and second vane elements which extend transversely to the heat-dissipating elements and outwardly from the heatsink and may extend at an angle to one another. The first and second vane elements may be mounted proximate opposite edges of the heatsink.

DISCLOSURE OF PREFERRED EMBODIMENT

Other objects, features and advantages will result from the following description of a preferred embodiment and the accompanying drawings, in which.

An airflow directional vane for a heatsink having a plurality of heat-dissipating elements which extend from a base according to this invention may be accomplished with a vane element that is mounted to at least one of the heat-dissipating elements of the heatsink. The vane element extends transversely through the heat-dissipating elements and outwardly from the heatsink so that it directs airflow across the heatsink through the heat-dissipating elements. The vane element is preferably mounted to the heatsink by at least one retaining portion which has an opening or other means for receiving a heat dissipating element. The retaining portion or other means for mounting the vane element to the heatsink may be connected to the vane element, integrally or otherwise, and carried proximate one end of the vane element. The directional vane preferably includes aluminum or other lightweight material which is simple and inexpensive to manufacture, which is somewhat resilient, and which effectively assists in the dissipation of heat from the heat-dissipating elements of the heatsink. The vane element may be constructed to be at least as tall as the heat-dissipating elements.

In a preferred construction, a pair of the above described vane elements are mounted to respective heat-dissipating elements of the heatsink. The vane elements are typically mounted proximate opposite edges of the heatsink. The vane elements extend outwardly from the heatsink and are typically arranged at an angle to one another.

The directional vanes may be employed with heatsinks using a variety of heat-dissipating elements. For example, for a multiple-pin heatsink the directional vane may include a retaining portion, forming a space or opening through which a pin is received. Alternatively, for the multiple fin variety of a heatsink the retaining member for mounting each vane element may include a bracket having a slot for receiving a respective fin. The airflow directional vanes of this invention increase the percentage of airflow that is captured and directed through the heat-dissipating elements of the heatsink from as low as 20% of the airflow directed at the heatsink to 75-80%, without requiring an expensive and complicated manifold construction.

Figure 1:
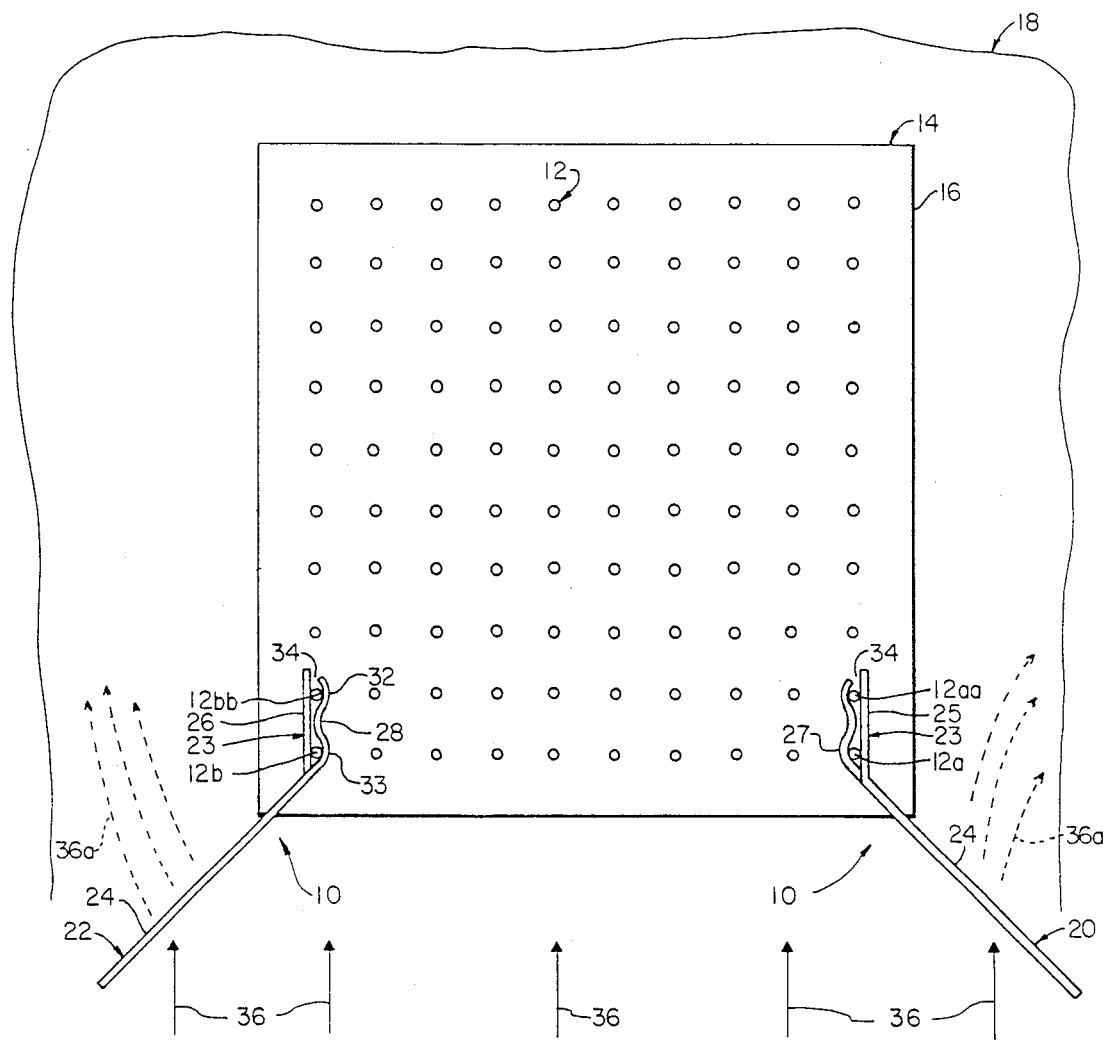
FIG. 1 is a plan view of a multiple-pin heatsink employing airflow directional vanes according to this invention.

There is shown in FIG. 1 an airflow directional vane apparatus 10 which is directly mounted to the heat-dissipating pins 12 of a heatsink 14. The heatsink includes a base element 16 from which pins 12 extend in an upward direction. Heatsink 14 is mounted, for example, on a printed circuit board 18 and serves to dissipate heat generated by the components on the board through base 16 and pins 12.

Figure 2:
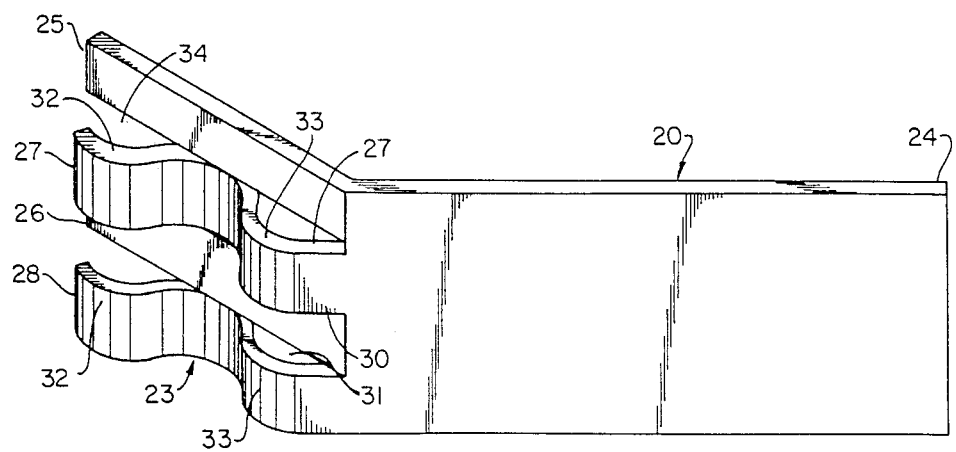
FIG. 2 is an axonometric view of a preferred vane used in the heat sink device of FIG. 1.

Vane apparatus 10 includes a pair of identical directional vanes 20, shown alone in FIG. 2, and 22. Each vane includes an elongate vane element 24 and an integral retaining portion 23. As shown most clearly in FIG. 2, retaining portion 23 includes alternating pairs of substantially flat straight members 25, 26 and curved members 27, 28. The curved members are typically formed by cutting or stamping mounting portion 23 along lines 29, 30 and 31 and each includes a pair of concave portions 32, 33. As shown most clearly in FIG. 1, a pin receiving space 34 is formed between members 25, 26 and members 27, 28. The respective pairs of members may be resiliently spreadable to adjust the size of space 34.

Vanes 20 and 22 are mounted directly onto pins 12 by inserting pins 12a, 12aa, 12b, 12bb between the straight and curved members of the vane's retaining portions. For example, retaining portion 23 of vane 20 receives within its space 34 adjacent pins 12a and 12aa that are located along one edge of the heatsink. Pin 12a is held between straight members 25, 26 and concave portions 32a of curved members 27 and 28. Pin 12aa is similarly held between members 25, 26 and concave portions 33 of members 27, 28. Curved member 28 engages base 16 of the heatsink.

Figure 3:
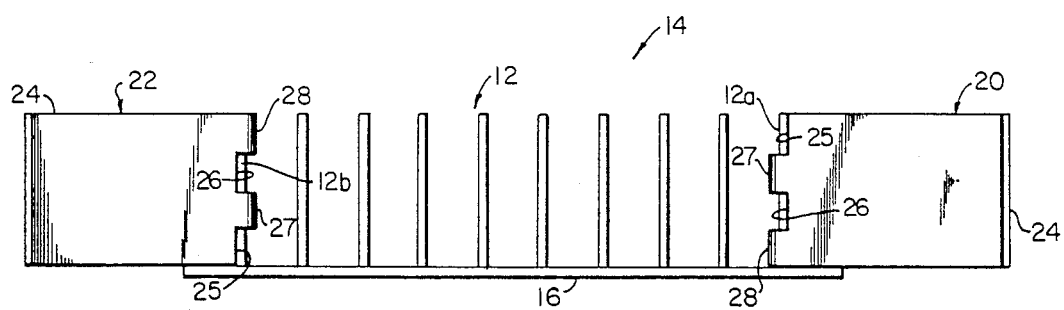
FIG. 3 is an elevational front view of the heatsink and attached directional vanes of FIG. 1.

Vane 22 is likewise attached to heatsink 14 by inverting the vane from the position of vane 20 and similarly engaging its retaining portion 23 with adjacent pins 12b and 12bb of the column of pins arranged along the opposite edge of the heatsink. As shown in FIG. 3, with vane 22 inverted, straight member 25 engages heatsink base 16.

With vanes 20 and 22 mounted to the heatsink their respective vane elements extend outwardly from heatsink 14 in a direction transverse to the direction in which pins 12 extend from base 16 and at an angle of, for example, 90° to each other. The vanes are removed or replaced simply by lifting them upwardly from the heatsink or otherwise disengaging the retaining portions from the heatsink pins.

In operation, airflow 36, FIG. 1, is provided by a conventional fan or blower, not shown. Vane elements 24 capture the airflow 36, which without the presence of the vanes would pass as airflow 36a on either side of heatsink 14, and channels that airflow to pass across heatsink 14 through heat-dissipating pins 12. As much as 75-80% or more of the total airflow 36 is forced through heat-dissipating pins 12 so that cooling of the pins is accelerated and heat dissipation is greatly improved. The heat-dissipating capability of heatsink 14 is increased still further if directional vanes 20 and 22 are constructed of a heat-dissipating material such as aluminum.

Figure 4A:
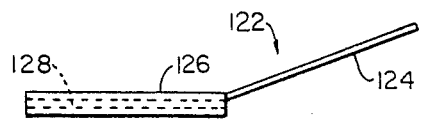
FIG. 4A is a top view of an alterative airflow directional vane according to this invention.
Figure 4B:
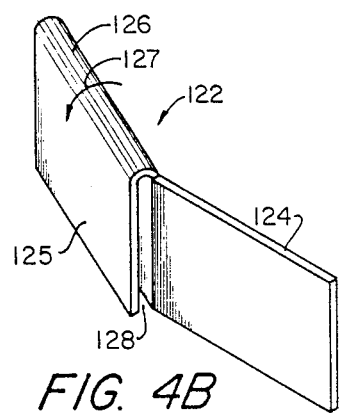
FIG. 4B is an axonometric view of the vane of FIG. 4A.

An alternative airflow directional vane 122 is shown in FIGS. 4A and 4B. This vane is used for multiple-fin heatsinks and includes a vane portion 124 and a retaining bracket portion 126 that is attached integrally or otherwise to one end of vane element 124. The bracket is typically formed by folding over metal portion 125 in the direction of arrow 127. As in the prior embodiment directional vane 122 is preferably composed of a lightweight heat-dissipating material such as aluminum. Retaining bracket 126 includes an elongate slot 128 for receiving a respective fin of the multiple-fin heatsink.

Figure 5:
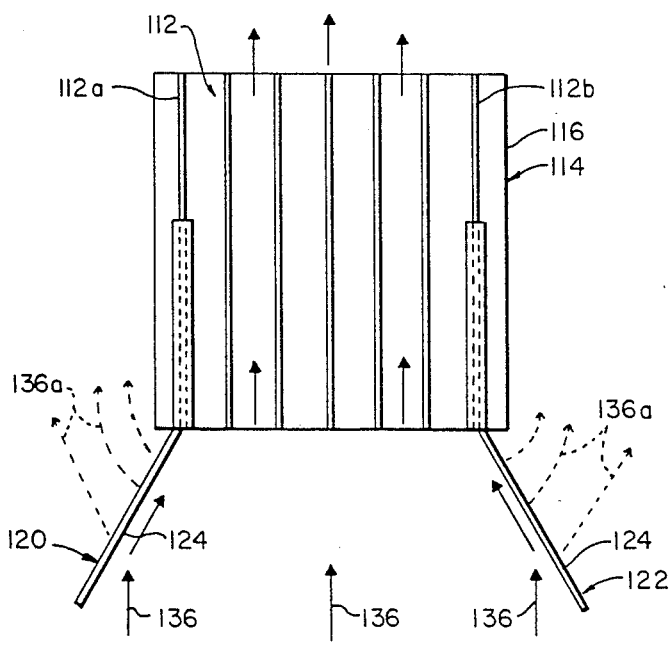
FIG. 5 is a plan view of a multiple-fin heatsink employing the directional vanes of FIGS. 4A and 4B.

As shown in FIG. 5, directional vane 122 and a similar vane 120 are mounted to multiple-fin heatsink 114. The heatsink includes a base 116 of having a plurality of generally parallel elongate heat-dissipating fins 112 extending from its upper surface. Slot 128 of the retaining bracket of vane 120 receives end fin 112a to mount directional vane 120 proximate one edge of heatsink 114. Similarly, slot 128 of directional vane 122 receives end fin 112b to mount vane 122 proximate the opposite edge of heatsink 114. Vane elements 124 of respective directional vanes 120 and 122 extend transversely to the direction which fins 112 extend from base 116 and outwardly from the forward edge of heatsink 114 at an angle of approximately 90° to one another. Airflow 136 directed at the forward edge of heatsink 114 is channeled by directional vanes 120 and 122 through the fins 112 of the heatsink so that the fins are cooled and heat dissipation is improved. As a result, airflow 136a which would otherwise pass on the sides of heatsink 116 is greatly reduced and is instead largely directed across the heatsink through its fins 112.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A self-mounting airflow directional vane for a heatsink having a plurality of heat-dissipating elements which extend from a base comprising:
   a vane portion extending outwardly from the heatsink to direct airflow across the heatsink through the heat-dissipating elements; and
   a self-securing clamping portion integral with said vane portion for frictionally gripping and engaging at least one of said heat-dissipating elements.

2. The directional vane of claim 1 in which said heat dissipating element of a heatsink is a pin.

3. The directional vane of claim 2 in which said clamping portion includes at least one straight member and one curved member.

4. The directional vane of claim 3 in which said curved member includes an alternating concave, convex curvature form.

5. The directional vane of claim 1 in which said heat dissipating element of a heatsink is a fin.

6. The directional vane of claim 5 in which said clamping portion includes an elongated slot for receiving an associated fin of a multiple fin heatsink.

7. The directional vane of claim 1 in which said directional vane includes a heat conducting material.

8. A self-mounting airflow directional vane apparatus for a heatsink having a plurality of heat-dissipating elements which extend from a base comprising:

first and second vane portions extending transversely to said heat-dissipating elements and outwardly from the heatsink to direct airflow across the heatsink through the heat-dissipating elements; and a self-securing clamping portion integral with each of said vane portions for frictionally gripping and engaging at least one of said heat-dissipating elements.

9. The directional vane apparatus of claim 8 in which said heat dissipating element of a heatsink is a pin.

10. The directional vane apparatus of claim in which said clamping portion includes at least one straight member and one curved member.

11. The directional vane apparatus of claim 1 in which each of said curved members includes an alternating concave, convex curvature form.

12. The directional vane apparatus of claim 10 in which said heat dissipating element of a heatsink is a fin.

13. The directional vane apparatus of claim 12 in which said clamping portion includes an elongated slot for receiving an associated fin of a multiple fin heatsink.

14. The directional vane apparatus of claim 8 in which each of said directional vanes includes a heat conducting material.

15. The airflow directional vane apparatus of claim 8 in which said self-securing clamping portions frictionally mount said first and second vane portions proximate opposite edges of said heatsink.

16. The airflow directional vane apparatus of claim 8 in which said first and second vane portions extend from said heatsink at an angle to one another.

* * * * *